United States Patent [19]
Erftemeijer et al.

[11] Patent Number: 5,216,390
[45] Date of Patent: Jun. 1, 1993

[54] OSCILLATOR HAVING A LINEAR FREQUENCY VERSUS CURRENT CHARACTERISTIC

[75] Inventors: Franciscus G. Erftemeijer; Wouter M. Boeke, both of Hilversum, Netherlands

[73] Assignee: U.S. Philips Corporation, New York, N.Y.

[21] Appl. No.: 820,189

[22] Filed: Jan. 14, 1992

[30] Foreign Application Priority Data

Jan. 16, 1991 [NL] Netherlands .......................... 9100066

[51] Int. Cl.$^5$ ............................................. H03K 3/354
[52] U.S. Cl. .................................. 331/113 R; 331/144; 331/177 R
[58] Field of Search ...................... 331/34, 113 R, 144, 331/145, 177 R

[56] References Cited

U.S. PATENT DOCUMENTS 4,360,789 11/1982 Lewyn et al. ........................ 331/109
4,947,140 8/1990 Tateishi ............................ 331/113 R

FOREIGN PATENT DOCUMENTS 0361529 4/1990 European Pat. Off. .
2143393 2/1985 United Kingdom .

OTHER PUBLICATIONS

Wescon Conference Record vol. 24, Anaheim, Calif. pp. 2641–2646, Richard Kash "Analog MOS on Semi-Custom Integrated Circuits", Sep. 16–18, 1980.

Primary Examiner—Siegfried H. Grimm
Attorney, Agent, or Firm—Bernard Franzblau

[57] ABSTRACT

An oscillator comprising a first and a second transistor having their sources interconnected via a capacitor and in which each gate is connected to the drain of the other transistor and each drain is connected to a load circuit. A load circuit in the form of a resistor produces a nonlinear transfer characteristic. By arranging each load circuit in the form of a parallel combination of two transistors of which a first gate is connected to the drain of the first transistor and of which a second gate is connected to the drain of the second transistor, an oscillator presenting a more linear transfer characteristic is obtained. With different frequency adjusting circuits this transfer characteristic can be realized in a first-order approximation or can even be totally independent of the threshold voltage of the transistors used.

18 Claims, 1 Drawing Sheet

OSCILLATOR HAVING A LINEAR FREQUENCY VERSUS CURRENT CHARACTERISTIC

BACKGROUND OF THE INVENTION

This invention relates to an oscillator comprising a first and a second transistor each including a first main electrode, which first main electrodes are mutually coupled via a capacitor, and each including a second main electrode coupled to a gate electrode of the other transistor. The second main electrode of the first transistor is coupled to a first load circuit and the second main electrode of the second transistor is coupled to a second load circuit.

An oscillator of this type is generally known. If each load circuit is constituted by a resistor R and each first main electrode is connected to a current source that produces a current of the magnitude I, the oscillator will generate a square-wave output voltage between the two second main electrodes with a frequency $f_{osc} = I/(2C^* V_c)$, where C represents the capacitance value of the capacitor and $V_c$ is the voltage across this capacitor. The desired frequency $f_{osc}$ is obtained by selecting an appropriate value for the current I.

Because the conductance of a transistor is proportional to the square root of the main current through this transistor and because the conductance of a resistor R is constant ($=1/R$), the voltage $V_c$ (non-linear) becomes dependent on the current I. Consequently, the relation between the frequency $f_{osc}$ and the current I exhibits a non-linear characteristic. This is undesired, for example, in phase-locked loop applications in which an oscillator of this type is used.

SUMMARY OF THE INVENTION

It is an object of the invention to provide an oscillator of the type mentioned in the opening paragraph in which there is a linear relation between the frequency $f_{osc}$ and the current I.

The oscillator according to the invention is characterized in that the first load circuit comprises a parallel combination of a third and a fourth transistor and in that the second load circuit comprises a parallel combination of a fifth and a sixth transistor, gate electrodes of the third and fifth transistors each being coupled to the second main electrode of the first transistor and gate electrodes of the fourth and sixth transistors each being coupled to the second main electrode of the second transistor.

In forming each load circuit with the aid of transistors, the conductances of the load circuits are also proportional to the square root of the current. Thus, the relation between the frequency $f_{osc}$ and the current I becomes more linear.

It should be observed that it is widely known that a resistor can simply be realised by a single transistor in that the gate electrode of this transistor is connected to one of the main electrodes. A load circuit realised in this fashion does have the disadvantage, however, that its impedance is undefined during the period of time when no current flows through the transistor. This is undesired in the oscillator according to the invention.

An embodiment of the oscillator according to the invention is characterized in that the W/L ratios of the first and second transistors are substantially equal, in that the W/L ratios of the third and sixth transistors are substantially equal and in that the W/L ratios of the fourth and fifth transistors are substantially equal, whereas the W/L ratios of the third and sixth transistors are larger than the W/L ratios of the fourth and fifth transistors.

Thus, by arranging the oscillator in a substantially symmetrical fashion, the sensitivity of the oscillator for common mode noise voltages is strongly reduced. Because the W/L ratios of the third and sixth transistors are larger than the W/L ratios of the fourth and fifth transistors, it is avoided that the load circuits individually start to oscillate.

Another embodiment of the oscillator according to the invention is characterized in that the oscillator comprises a frequency adjusting circuit which includes a seventh, an eighth and a ninth transistor, a gate electrode and a main electrode of the seventh transistor being mutually coupled and coupled to a first main electrode of the eighth transistor, a gate electrode and a second main electrode of the eight transistor being mutually coupled and coupled to a gate electrode of the ninth transistor, whereas the second main electrode of the eighth transistor can be coupled to a current source and the ninth transistor is coupled to a connecting circuit coupled to the first main electrodes of the first and second transistors.

The frequency of such an oscillator can be simply adjusted and varied. The connecting circuit may be realised in a manner known to those skilled in the art by serially combining a first connecting circuit transistor to the first transistor and a second connecting circuit transistor to the second transistor, and by connecting gate electrodes of the two above connecting circuit transistors to a gate electrode and to a main electrode of a third connecting circuit transistor which is to be combined in series with the ninth transistor. The value of the current generated by the current source then determines the main current flowing through the ninth transistor and through the third connecting circuit transistor combined in series therewith and, therefore, also determines the main currents flowing through the first and second connecting circuit transistors. This determines the maximum frequency of the oscillator, which maximum frequency can simply be reduced by connecting in series between the third connecting circuit transistor and a ninth transistor a fourth connecting circuit transistor, which fourth transistor can be shut off by means of a control voltage on its gate electrode. This operation likewise shuts off transistor 9 so that the main current through the third connecting circuit transistor and the associated frequency of the oscillator are reduced.

An oscillator according to the invention comprising a frequency adjusting circuit of this type is advantageous in that the frequency $f_{osc}$ in a first-order approximation is independent of $V_T$ (threshold voltage) of the transistors used. Since the $V_T$ of different transistors may vary considerably and is strongly temperature-dependent, this embodiment of the oscillator is advantageous.

A further embodiment of the oscillator according to the invention is characterized in that the frequency adjusting circuit further includes a tenth, an eleventh and a twelfth transistor as well as a converter, a main electrode and a gate electrode of the tenth transistor being mutually coupled and coupled to a main electrode of the ninth transistor and to a gate electrode of the eleventh transistor, a main electrode of the eleventh transistor being coupled to a gate electrode and a main electrode of the twelfth transistor, a first input terminal of the converter being coupled to the gate electrode of the twelfth transistor, a second input terminal of the converter being coupled to the gate electrode of the seventh transistor and an output of the converter being coupled to the connecting circuit. In an oscillator according to the invention comprising such a frequency adjusting circuit, the frequency $f_{osc}$ is totally independent of $V_T$ of the transistors used. Consequently, this embodiment is highly advantageous.

The invention further relates to a load element comprising the first and second load circuits suitable for use in an oscillator according to the invention, and further relates to a frequency adjusting circuit suitable for use in an oscillator according to the invention.

BRIEF DESCRIPTION OF THE DRAWING

The invention will be further explained with reference to several exemplary embodiments represented in the accompanying drawing, in which like elements are referenced by the same reference characters, in which.

DESCRIPTION OF THE PREFERRED EMBODIMENTS

Figure 1:
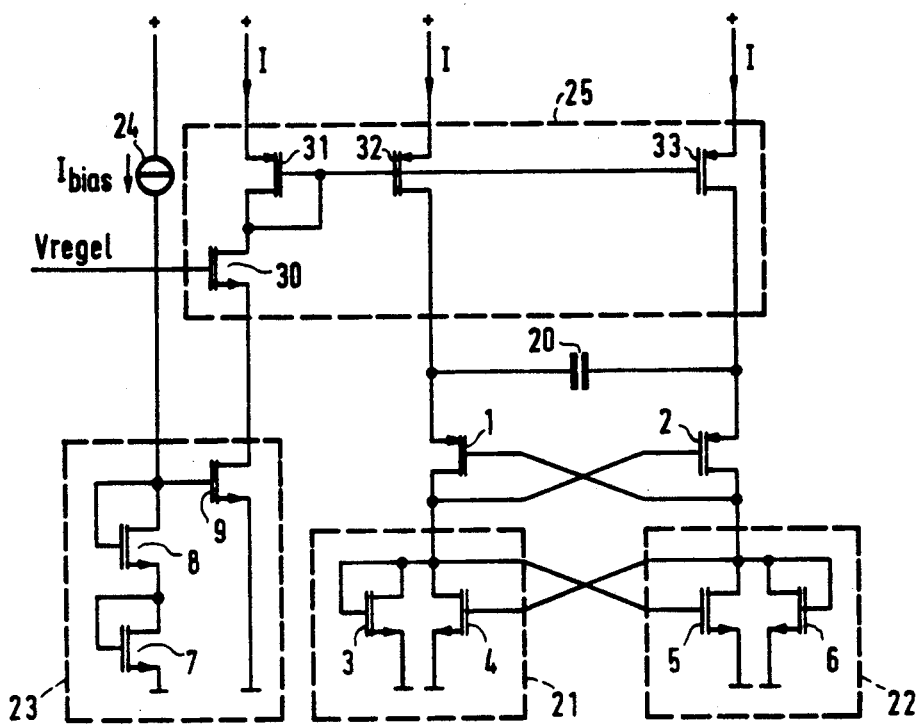
FIG. 1 shows the oscillator according to the invention, comprising a simple frequency adjusting circuit.

The oscillator represented in FIG. 1 comprises a first transistor 1 and a second transistor 2 whose sources are mutually connected through a capacitor 20. The drain of transistor 1 is connected to the gate of transistor 2 and to a first load circuit 21. The drain of transistor 2 is connected to the gate of transistor 1 and to a second load circuit 22. Load circuit 21 comprises a parallel combination of a third transistor 3 and a fourth transistor 4, whose sources are connected to ground and whose drains are connected to the drain of transistor 1. The gate of transistor 3 is also connected to the drain of transistor 1 and the gate of transistor 4 is connected to the drain of transistor 2. Load circuit 22 comprises a parallel combination of a fifth transistor 5 and a sixth transistor 6, whose sources are connected to ground and whose drains are connected to the drain of transistor 2. The gate of transistor 6 is also connected to the drain of transistor 2 and the gate of transistor 5 is connected to the drain of transistor 1.

If a current I is applied to the two sources of the transistors 1 and 2, there will be a triangle voltage having a peak amplitude equal to 2 $V_c$ across the capacitor 20. Between the two drains of the transistors 1 and 2 there will then be a square-wave voltage having a frequency $f_{osc}=I/(C*2V_c)$. This current I is applied to the two sources through a connecting circuit 25 connected to a frequency adjusting circuit 23. With this adjusting circuit the current I may be varied as a result of which the frequency $f_{osc}$ can be adjusted.

The connecting circuit 25 comprises a first connecting transistor 32 whose source is connected to a positive voltage source and whose drain is connected to the source of transistor 1, a second connecting transistor 33 whose source is connected to the voltage source and whose drain is connected to the source of transistor 2, a third connecting transistor 31 whose source is connected to the voltage source and whose gate and drain are interconnected and also connected to the gates of connecting transistors 32 and 33, and a fourth connecting transistor 30 whose drain is connected to the drain of connecting transistor 31 and whose source is connected to the frequency adjusting circuit 23.

The gate of connecting transistor 30 is connected to an adjustable source of obtaining a control voltage with which the degree of conductance of this connecting transistor 30 and of transistor 9 can be adjusted.

The frequency adjusting circuit 23 comprises a seventh transistor 7, an eight transistor 8 and a ninth transistor 9. The source of transistor 7 is connected to ground and the gate and drain are interconnected and are further connected to the source of transistor 8, whose gate and drain are interconnected and are further connected to the gate of transistor 9. The drain of transistor 8 is further connected to a current source 24 for generating a current $I_{bias}$ through the main current paths of transistors 7 and 8. The source of transistor 9 is connected to ground and the drain is connected to the source of connecting transistor 30, through which connection the connecting circuit 25 and the frequency adjusting circuit 23 are interconnected.

The operation of the circuit described hereinbefore is as follows. Current source 24 produces a current $I_{bias}$ which flows to ground through the main current paths of the transistors 8 and 7. Consequently, there will be a voltage at the gates of transistors 8 and 9 that renders transistor 9 conductive. The magnitude of the current I which flows to ground through the main current paths of the respective transistors 31, 30 and 9 may be varied in a simple fashion by varying the control voltage at the gate of transistor 30 so that transistors 30 and 9 are made to conduct to a smaller or greater extent. Due to the current mirror arrangement this current I also flows through the main current paths of transistors 32 and 33 and the current I is thus applied to the sources of transistors 1 and 2 of the actual oscillator circuit. As a result, there will be a triangle voltage having a peak amplitude of 2 $V_c$ across capacitor 20 and there will be a square-wave voltage having a frequency $f_{osc}=I/(C*2V_c)$ between the drains of transistor 1 and 2. Since the current I is variable as a result of the control voltage on the gate of transistor 30, the frequency $f_{osc}$ is also variable (proportional to the current I).

By means of measurements as well as a complicated calculation, it can be demonstrated that the peak to peak amplitude 2 $V_c$ of the triangle voltage across the capacitor 20 is proportion to $+V_T$ (threshold voltage of the transistors used). A simple calculation shows that for the main current through transistor 9 of the frequency adjusting circuit, in a first-order approximation, it also holds that this main current is proportional to $+V_T$. Because $f_{osc}=I/(C*2V_c)$ and both $V_c$ and I in a first-order approximation are proportional to $+V_T$, $f_{osc}$ in a first approximation is independent of $V_T$. However, if a conventional frequency-adjusting circuit were used, in the form of a single transistor switched as a current source and whose main current was proportional to $-V_T$, an x % variation of $V_T$ would have caused a variation of over x % of $f_{osc}$, which is highly detrimental.

Figure 2:
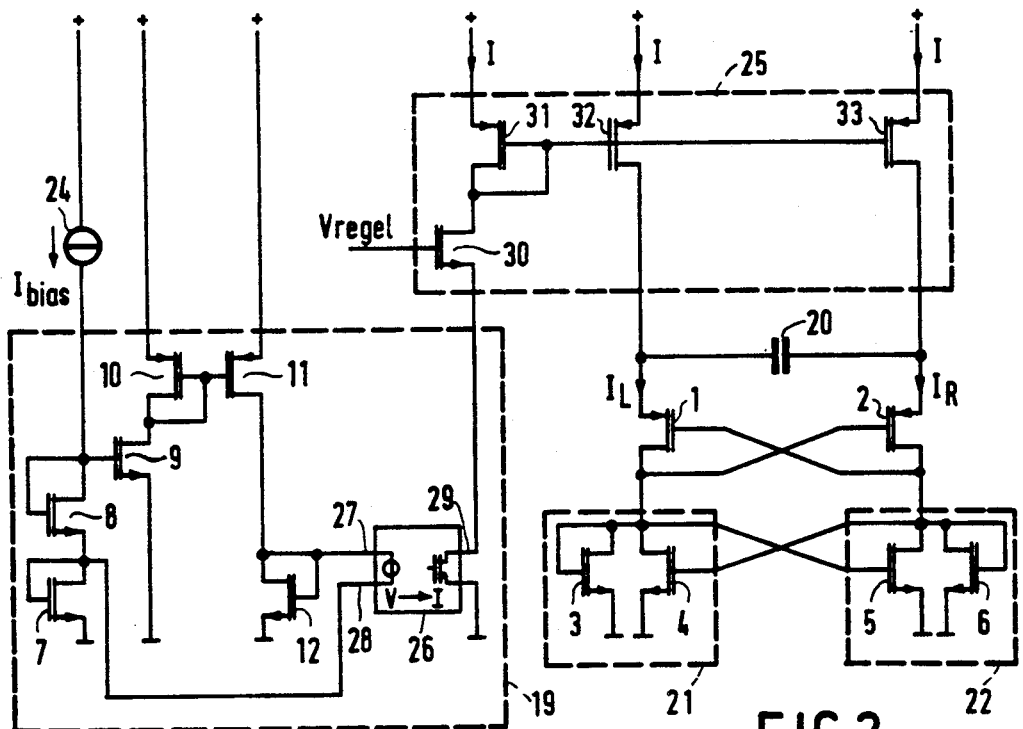
FIG. 2 shows the oscillator according to the invention comprising a more complicated frequency adjusting circuit.

The oscillator represented in FIG. 2 differs from the oscillator represented in FIG. 1 only as regards the frequency adjusting circuit used. For the rest the two oscillators are identical.

Frequency adjusting circuit 19 comprises, as does frequency adjusting circuit 23, the transistors 7, 8 and 9 and the current source 24, which are all interconnected in the same fashion. The drain of transistor 9 is connected to the drain and gate of a tenth transistor 10 and to the gate of an eleventh transistor 11. The sources of the two transistors 10 and 11 are connected to the voltage source. The drain of transistor 11 is connected to the gate and drain of a twelfth transistor 12 whose source is connected to ground. Furthermore, the gate of this transistor 12 is connected to a first input terminal 27 of a converter 26 converting an input voltage into a current. A second input terminal 28 of this converter is connected to the drain and gate of transistor 7. Output terminal 29 of converter 26 is connected to the source of connecting transistor 30.

The operation of the oscillator represented in FIG. 2 is identical to that of the oscillator represented in FIG. 1, with the exception of the operation of the more complicated frequency adjusting circuit 19 and its consequences to the remaining part of the oscillator.

The operation of the frequency adjusting circuit 19 and the consequences of this circuit on the oscillator are as follows. Current source 24 produces a current $I_{bias}$, which flows to ground through the main current paths of the transistor 7 and 8. This causes a voltage to occur on the gates of transistors 7, 8 and 9 so that transistor 9 is rendered conductive. The current flowing through transistor 9 also flows through transistor 10 and, as a result of the current mirror function, a current of about the same magnitude also flows through transistor 11. This current causes a voltage to occur across the transistor 12 connected as a diode, which voltage appears at the input 27 of converter 26. The voltage difference between the drain of transistor 12 and that of transistor 7 is converted by converter 26 into a current which flows through the main current paths of the connecting transistors 31 and 30. As a result of the current mirror structure in the connecting circuit 25, currents of the same magnitude will flow through the main current paths of the transistors 32 and 33, and so on.

By simply choosing the ratios of the transistors 7-12 in such a way that the voltage difference between the input terminals 27 and 28 is proportional to $V_T$, and having the converter 26 operate according to $I_{out} = U_{in}/R$, where R is a constant, it is achieved that the oscillator represented in FIG. 2 has an oscillation frequency $f_{osc}$ which is independent of $V_T$.

For example, if the W/L ratios of the transistors 7 and 8 are substantially equal, if the W/L ratios of the transistors 10 and 11 are substantially equal and if the W/L ratio of transistor 12 is about 4× as large as the W/L ratio of transistor 9, there will be a voltage difference of $V_T/2$ between the input terminals 27 and 28. The maximum value of the current I from the equation $f_{osc}=I/(C*2V_c)$ will then be equal to $V_T/2R$ and thus will have a linear relationship to $V_T$ with a constant R. For example, if the W/L ratios of the transistors 1, 2 correspond to $\beta_p$, if the W/L ratios of the transistors 3,6 correspond to $\beta_y$ and if the W/L ratios of the transistors 4,5 correspond to $\beta_x$, and, furthermore, it holds that:

$$\frac{(a-1)^2}{\beta_p} = \frac{a^2}{\beta_y} - \frac{1}{\beta_x} \text{ with } a = \sqrt{\frac{I_r}{I_l}} \quad \Delta A = \frac{\beta_x}{\beta_y}\sqrt{2\beta_y}$$

and that $$\frac{(a-1)^2}{\beta_p} = \frac{a^2}{\beta_y} - \frac{1}{\beta_x} \text{ with } a = \sqrt{\frac{I_r}{I_l}} \quad \Delta A = \frac{\beta_x}{\beta_y}\sqrt{2\beta_y}$$

where Ir is the main current through transistor 2 and Il is the main current through transistor 1 if one of the transistors 4, 5 has a triode function and the other one is blocking or vice versa, in that case $V_c = V_T$. In this situation it then holds that $I = V_T/2R$ and $V_c = V_T$ through which for $f_{osc}$ is found that: $f_{osc} = I/(C*2V_c) = \frac{1}{4}RC$. The frequency $f_{osc}$ is then totally independent of $V_T$ and has a maximum value of $\frac{1}{4}RC$. This frequency $f_{osc}$ is decreased in a linear fashion when a lower control voltage is applied to the gate of transistor 30.

We claim:

1. An oscillator comprising: a first and a second transistor each including a first main electrode, said first main electrodes being mutually coupled via a capacitor, each transistor including a second main electrode coupled to a gate electrode of the other transistor, means coupling the second main electrode of the first transistor to a first load circuit and the second main electrode of the second transistor to a second load circuit, wherein the first load circuit comprises a parallel combination of a third and a fourth transistor and the second load circuit comprises a parallel combination of a fifth and a sixth transistor, gate electrodes of the third and fifth transistors each being coupled to the second main electrode of the first transistor and gate electrodes of the fourth and sixth transistors each being coupled to the second main electrode of the second transistor, and a frequency adjusting circuit including a further transistor having a first main electrode coupled to a reference voltage, a control electrode coupled to a bias voltage, and a second main electrode coupled to the first main electrodes of the first and second transistors via a connecting circuit.

2. An oscillator as claimed in claim 1 wherein said connecting circuit comprises at least one other transistor.

3. An oscillator as claimed in claim 1 wherein said connecting circuit comprises at least one other transistor connected in series circuit with said further transistor and having a control electrode coupled to a control voltage by means of which the frequency of the oscillator can be varied.

4. An oscillator as claimed in claim 3 wherein said connecting circuit further comprises a current mirror circuit coupling said one other transistor to the first main electrodes of the first and second transistors.

5. An oscillator as claimed in claim 4 wherein said bias voltage comprises a current source connected in series with at least one diode-connected transistor and with said control electrode of the further transistor connected to a junction point between the current source and the diode-connected transistor.

6. An oscillator comprising: a first and a second transistor each including a first main electrode, said first main electrodes being mutually coupled via a capacitor, each transistor including a second main electrode coupled to a gate electrode of the other transistor, means coupling the second main electrode of the first transistor to a first load circuit and the second main electrode of the second transistor to a second load circuit, wherein the first load circuit comprises a parallel combination of a third and a fourth transistor and the second load circuit comprises a parallel combination of a fifth and a sixth transistor, gate electrodes of the third and fifth transistors each being coupled to the second main electrode of the first transistor and gate electrodes of the fourth and sixth transistors each being coupled to the second main electrode of the second transistor, and wherein the W/L ratios of the first and second transistors are substantially equal, the W/L ratios of the third and sixth transistors are substantially equal and the W/L ratios of the fourth and fifth transistors are substantially equal, the W/L ratios of the third and sixth transistors being greater than the W/L ratios of the fourth and fifth transistors.

7. An oscillator as claimed in claim 6, characterized in that the oscillator comprises a frequency adjusting circuit which includes a seventh, eighth and a ninth transistor, a gate electrode and a main electrode of the seventh transistor being mutually coupled and coupled to a first main electrode of the eighth transistor, a gate electrode and a second main electrode of the eight transistor being mutually coupled and coupled to a gate electrode of the ninth transistor, wherein the second main electrode of the eight transistor can be coupled to a current source and the ninth transistor is coupled to a connecting circuit coupled to the first main electrodes of the first and second transistors.

8. An oscillator as claimed in claim 7, characterized in that the frequency adjusting circuit further includes a tenth, an eleventh and a twelfth transistor and a converter, a main electrode and a gate electrode of the tenth transistor being mutually coupled and coupled to a main electrode of the ninth transistor and to a gate electrode of the eleventh transistor, a main electrode of the eleventh transistor being coupled to a gate electrode and a main electrode of the twelfth transistor, a first input terminal of the converter being coupled to the gate electrode of the twelfth transistor, a second input terminal of the converter being coupled to the gate electrode of the seventh transistor and an output of the converter being coupled to the connecting circuit.

9. An oscillator comprising: a first and a second transistor each including a first main electrode, said first main electrodes being mutually coupled via a capacitor, each transistor including a second main electrode coupled to a gate electrode of the other transistor, means coupling the second main electrode of the first transistor to a first load circuit and the second main electrode of the second transistor to a second load circuit, wherein the first load circuit comprises a parallel combination of a third and a fourth transistor and the second load circuit comprises a parallel combination of a fifth and a sixth transistor, gate electrodes of the third and fifth transistors each being coupled to the second main electrode of the first transistor and gate electrodes of the fourth and sixth transistors each being coupled to the second main electrode of the second transistor, characterized in that the oscillator comprises a frequency adjusting circuit which includes a seventh, eight and a ninth transistor, a gate electrode and a main electrode of the seventh transistor being mutually coupled and coupled to a first main electrode of the eight transistor, a gate electrode and a second main electrode of the eight transistor being mutually coupled and coupled to a gate electrode of the ninth transistor, wherein the second main electrode of the eight transistor can be coupled to a current source and the ninth transistor is coupled to a connecting circuit coupled to the first main electrodes o the first and second transistors.

10. An oscillator as claimed in claim 9, characterized in that the frequency adjusting further includes a tenth, an eleventh and a twelfth transistor and a converter, a main electrode and a gate electrode of the tenth transistor being mutually coupled and coupled to a main electrode of the ninth transistor and to a gate electrode of the eleventh transistor, a main electrode of the eleventh transistor being coupled to a gate electrode and a main electrode of the twelfth transistor, a first input terminal of the converter being coupled to the gate electrode of the twelfth transistor, a second input terminal of the converter being coupled to the gate electrode of the seventh transistor and an output of the converter being coupled to the connecting circuit.

11. An oscillator comprising: a first and a second transistor each including a first main electrode, said first main electrodes being mutually coupled via a capacitor, each transistor including a second main electrode coupled to a gate electrode of the other transistor, means coupling the second main electrode of the first transistor to a first load circuit and the second main electrode of the second transistor to a second load circuit, wherein the first load circuit comprises a parallel combination of a third and a fourth transistor and the second load circuit comprises a parallel combination of a fifth and a sixth transistor, control electrodes of the third and fifth transistors each being coupled to the second main electrode of the first transistor and control electrodes of the fourth and sixth transistors each being coupled to the second main electrode of the second transistor, and a frequency adjusting circuit coupled to said first and second transistors via a connecting circuit including at least one other transistor, wherein said frequency adjusting circuit includes a further transistor connected in series circuit with said one other transistor, and means for applying a bias voltage to a control electrode of said further transistor, and wherein said frequency adjusting circuit causes a current of adjustable amplitude to flow in said first and second transistors thereby to adjust the oscillator frequency.

12. An oscillator as claimed in claim 11 wherein said connecting circuit further comprises a current mirror circuit coupling said one other transistor to the first main electrodes of the first and second transistors.

13. An oscillator as claimed in claim 12 wherein a control electrode of said one other transistor is coupled to a control voltage which is variable to adjust the amplitude of the currents flowing in said first and second transistors.

14. An oscillator comprising: a first and a second transistor each including a first main electrode, said first main electrodes being mutually coupled via a capacitor, each transistor including a second main electrode coupled to a gate electrode of the other transistor, means coupling the second main electrode of the first transistor to a first load circuit and the second main electrode of the second transistor to a second load circuit, wherein the first load circuit comprises a parallel combination of a third and a fourth transistor and the second load circuit comprises a parallel combination of a fifth and a sixth transistor, control electrodes of the third and fifth transistors each being coupled to the second main electrode of the first transistor and control electrodes of the fourth and sixth transistors each being coupled to the second main electrode of the second transistor, and a frequency adjusting circuit coupled to said first and second transistors via a connecting circuit including at least one other transistor, wherein said frequency adjusting circuit comprises, a further transistor, means for applying a bias voltage to a control electrode of said further transistor, and a voltage to current converter having an input coupled to said further transistor and an output coupled to said one other transistor of the connecting circuit, said frequency adjusting circuit causing a current of adjustable amplitude to flow in said first and second transistors thereby to adjust the oscillator frequency.

15. An oscillator as claimed in claim 14 wherein a control electrode of said one other transistor is coupled to a control voltage which is variable to adjust the amplitude of the currents flowing in said first and second transistors.

16. An oscillator as claimed in claim 14 wherein said input of the voltage to current converter receives an input voltage ($V_{in}$) proportional to transistor threshold voltage ($V_T$) and the voltage to current converter provides an output current, $I_{out}=V_{in}/R$, where R is a constant, whereby the oscillator frequency is independent of $V_T$.

17. An oscillator as claimed in claim 14 wherein said bias voltage applying means comprises, a current source connected in series with at least one diode-connected transistor and with said control electrode of the further transistor connected to a junction point between the current source and the diode-connected transistor.

18. An oscillator as claimed in claim 17 wherein said connecting circuit further comprises a current mirror circuit coupling said one other transistor to the first main electrodes of the first and second transistors.

* * * * *